United States Patent
Lee et al.

(10) Patent No.: US 7,846,775 B1
(45) Date of Patent: Dec. 7, 2010

(54) UNIVERSAL LEAD FRAME FOR MICRO-ARRAY PACKAGES

(75) Inventors: Shaw Wei Lee, Cupertino, CA (US);
Nghia Thuc Tu, San Jose, CA (US);
Sadanand R. Patil, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 290 days.

(21) Appl. No.: 11/135,836

(22) Filed: May 23, 2005

(51) Int. Cl.
*H01L 21/00* (2006.01)

(52) U.S. Cl. .................. 438/112; 438/110; 438/127; 438/613; 438/617; 438/464; 257/E23.01; 257/E23.033

(58) Field of Classification Search ......... 438/106–127, 438/613, 617, 458, 464; 257/666, 668, 673, 257/676–678, 684, 690, 692–693, 697, 723–726, 257/731, 733, 778, E33.059, E23.01, E23.026, 257/E23.031–E23.034, E23.55, E23.021
See application file for complete search history.

(56) References Cited

U.S. PATENT DOCUMENTS

| | | | |
|---|---|---|---|
| 5,075,760 A | 12/1991 | Nakashima et al. | |
| 5,585,195 A | 12/1996 | Shimada | |
| 5,656,550 A | 8/1997 | Tsuji et al. | |
| 5,719,440 A | 2/1998 | Moden | |
| 5,759,874 A | 6/1998 | Okawa | |
| 5,830,800 A | 11/1998 | Lin | |
| 5,847,458 A | 12/1998 | Nakamura et al. | |
| 5,866,948 A | 2/1999 | Murakami et al. | |
| 5,895,234 A | 4/1999 | Taniguchi et al. | |
| 5,923,080 A | 7/1999 | Chun | |
| 5,998,875 A | 12/1999 | Bodo et al. | |
| 6,034,422 A | 3/2000 | Horita et al. | |
| 6,100,594 A | 8/2000 | Fukui et al. | |
| 6,130,473 A | * 10/2000 | Mostafazadeh et al. | ..... 257/666 |
| 6,157,080 A | 12/2000 | Tamaki et al. | |
| 6,177,288 B1 | 1/2001 | Takiar | |
| 6,238,952 B1 | 5/2001 | Lin | |
| 6,247,229 B1 * | 6/2001 | Glenn | ..... 29/841 |
| 6,255,740 B1 | 7/2001 | Tsuji et al. | |
| 6,258,626 B1 | 7/2001 | Wang et al. | |
| 6,261,864 B1 | 7/2001 | Jung et al. | |
| 6,306,684 B1 | 10/2001 | Richardson et al. | |
| 6,306,685 B1 | 10/2001 | Liu et al. | |
| 6,307,755 B1 | 10/2001 | Williams et al. | |
| 6,316,837 B1 | 11/2001 | Song | |
| 6,333,252 B1 | 12/2001 | Jung et al. | |

(Continued)

OTHER PUBLICATIONS

U.S. Appl. No. 10/625,917, filed Jul. 23, 2003.

(Continued)

*Primary Examiner*—Matthew C Landau
*Assistant Examiner*—Joseph C. Nicely
(74) *Attorney, Agent, or Firm*—Beyer Law Group LLP

(57) ABSTRACT

Techniques for forming micro-array style packages are disclosed. A matrix of isolated contact posts are placed on an adhesive carrier. Dice are then mounted (directly or indirectly) on the carrier and each die is electrically connected to a plurality of associated contacts. The dice and portions of the contacts are then encapsulated in a manner that leaves at least bottom portions of the contacts exposed to facilitate electrical connection to external devices. The encapsulant serves to hold the contacts in place after the carrier has been removed.

13 Claims, 6 Drawing Sheets

U.S. PATENT DOCUMENTS

| | | | |
|---|---|---|---|
| 6,342,730 B1 | 1/2002 | Jung et al. | |
| 6,355,507 B1 | 3/2002 | Fanworth | |
| 6,358,778 B1 | 3/2002 | Shinohara | |
| 6,372,539 B1 | 4/2002 | Bayan et al. | |
| 6,451,627 B1 | 9/2002 | Coffman | |
| 6,486,004 B1 * | 11/2002 | Wensel | 438/118 |
| 6,551,859 B1 * | 4/2003 | Lee et al. | 438/112 |
| 6,566,168 B2 * | 5/2003 | Gang | 438/123 |
| 6,683,368 B1 * | 1/2004 | Mostafazadeh | 257/676 |
| 6,689,412 B1 * | 2/2004 | Bourrieres | 427/58 |
| 6,689,640 B1 * | 2/2004 | Mostafazadeh | 438/121 |
| 6,706,558 B2 * | 3/2004 | Nakamura | 438/110 |
| 6,740,961 B1 * | 5/2004 | Mostafazadeh | 257/676 |
| 6,762,511 B2 | 7/2004 | Satsu et al. | |
| 6,812,552 B2 | 11/2004 | Islam et al. | |
| 6,967,125 B2 * | 11/2005 | Fee et al. | 438/112 |
| 6,975,022 B2 | 12/2005 | Sakamoto et al. | |
| 6,975,038 B1 * | 12/2005 | Mostafazadeh | 257/780 |
| 7,001,798 B2 | 2/2006 | Yamaguchi | |
| 7,095,096 B1 * | 8/2006 | Mostafazadeh | 257/666 |
| 7,211,467 B2 * | 5/2007 | Park et al | 438/111 |
| 7,491,625 B2 * | 2/2009 | Bayan et al. | 438/460 |
| 7,598,122 B1 * | 10/2009 | Bayan et al. | 438/112 |
| 7,642,175 B1 * | 1/2010 | Patwardhan et al. | 438/464 |
| 2002/0031868 A1 * | 3/2002 | Capote et al. | 438/126 |
| 2002/0192936 A1 * | 12/2002 | Ball | 438/613 |
| 2003/0045032 A1 * | 3/2003 | Abe | 438/123 |
| 2004/0070084 A1 * | 4/2004 | Kuramoto et al. | 257/779 |
| 2004/0171191 A1 * | 9/2004 | Connell et al. | 438/112 |
| 2005/0068757 A1 * | 3/2005 | Jayaraman et al. | 361/803 |
| 2006/0103019 A1 * | 5/2006 | Hodson | 257/737 |
| 2006/0234421 A1 * | 10/2006 | Lo et al. | 438/106 |
| 2007/0273011 A1 * | 11/2007 | Singleton et al. | 257/673 |
| 2008/0079127 A1 * | 4/2008 | Gerber | 257/676 |

OTHER PUBLICATIONS

U.S. Appl. No. 10/919,592, filed Aug. 16, 2004.

* cited by examiner

*- Prior Art -*

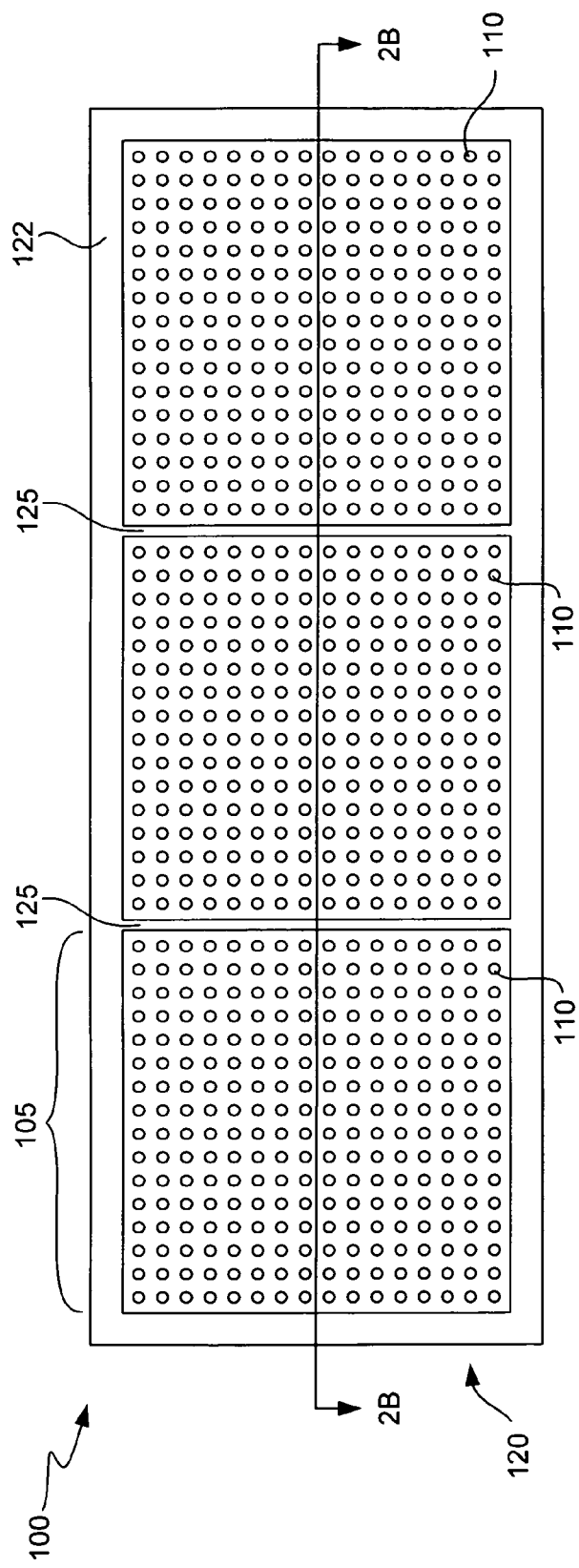
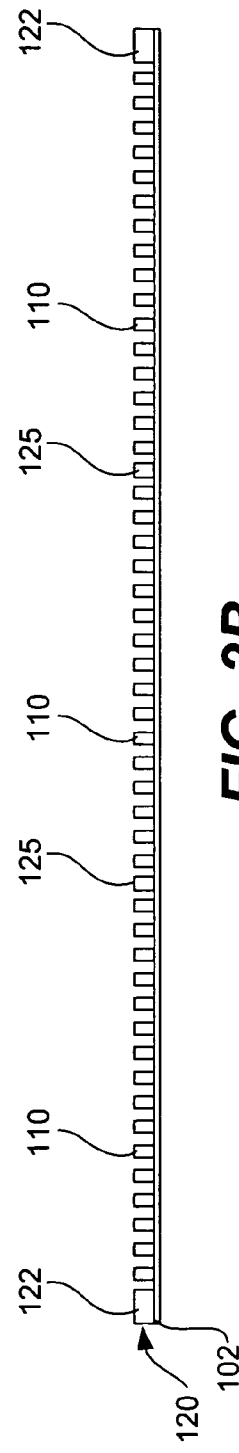
FIG. 2A
FIG. 2B

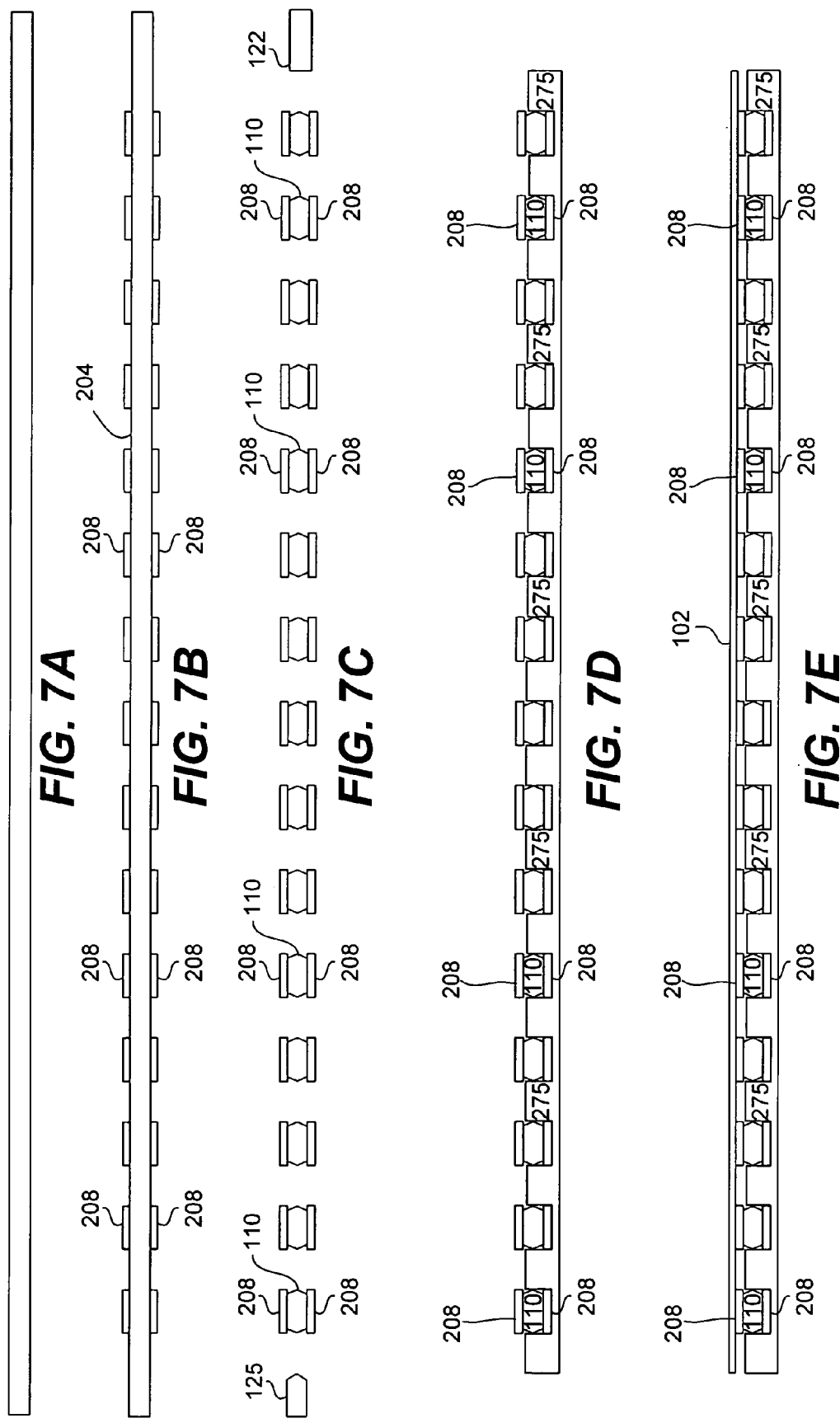

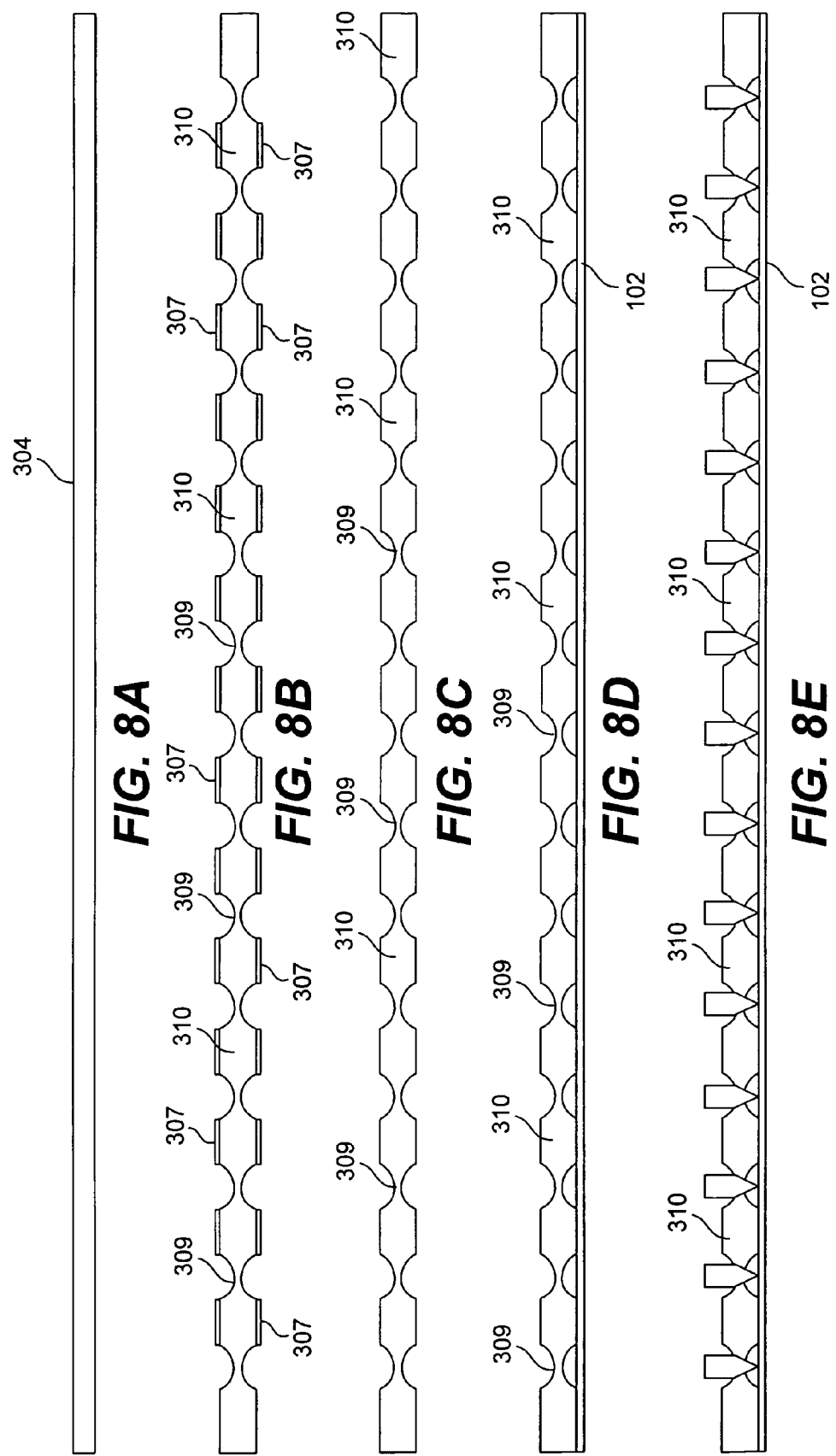

UNIVERSAL LEAD FRAME FOR MICRO-ARRAY PACKAGES

BACKGROUND OF THE INVENTION

The present invention relates generally to the packaging of integrated circuits in micro-array style packages.

There are a number of conventional processes for packaging integrated circuits. Many packaging techniques use a leadframe that has been stamped or etched from a metal (typically copper) sheet to provide electrical interconnects to external devices. One relatively recently developed packaging style, which is sometimes referred to as a leadframe based micro-array package is generally illustrated in FIG. 1. In a micro-array package, the leadframe typically includes an array of contact posts 22 that are exposed on the bottom surface of the package and lead traces 24 that may or may not be exposed at the bottom surface of the package. A die mounted on the lead frame is wire bonded (or otherwise electrically connected) to the lead traces, which serve as electrical connectors between the bonding wires and the contact posts 22. Often the micro-array package will also have a die support structure 26 that supports the die.

Micro-array packages have a number of potential advantages. For example, they are relatively low cost, they may be configured to be pin compatible with conventional BGA packages and they allow a relatively large number of contacts for a given package size. Also, since the lead traces permit "routing" of signals to contact pads located under the die, a package with a relatively smaller footprint may be used for a given die size and pin count as compared to many other leadframe based packages.

Some micro-array packaging approaches have dispensed with the lead traces and formed contact posts or pads that can be directly wire bonded to. By way of example, U.S. Pat. Nos., 6,683,368; 6,689,640; and 6,812,552 disclose such approaches. In these approaches, the lead frame is typically partially etched in order to define the contact pads that are supported by a thin connecting sheet that remains due to the partial etching. Dice are then mounted on and electrically connected to the lead frame and an encapsulant is molded (or otherwise dispensed) over the dice to form appropriate package structures. After the molding, the connecting sheet is etched away thereby leaving the contact pads exposed on the bottom surface of the package.

Given their many advantages, micro-array packages in general have recently generated a great deal of interest within the semiconductor industry. Although existing techniques for fabricating micro-array leadframes and for packaging integrated circuits using micro-array leadframe technology work well, there are continuing efforts to develop even more efficient designs and methods for packaging integrated circuits using micro-array leadframe technology.

SUMMARY OF THE INVENTION

To achieve the foregoing and other objects of the invention, methods of forming micro-array packages are disclosed. In one arrangement, a conductive panel is patterned to include at least one two dimensional array of contact posts. The patterned lead frame is then secured to an adhesive carrier. With the adhesive carrier in place, at least some of the contact posts are isolated to form a multiplicity of electrically and physically isolated contacts that are supported by the carrier. After the contacts have been isolated, dice are mounted on and electrically connected to a number of associated contacts. The dice and portions of the contacts are then encapsulated in a manner that leaves at least bottom portions of the contacts exposed to facilitate electrical connection to external devices. The encapsulant then serves to hold the contacts in place after the carrier has been removed.

The contact posts may be isolated by any of a number of techniques including punching, etching, sawing, laser cutting, etc. The conductive panel may take any of a variety of appropriate forms including, for example, a lead frame strip or panel, a conductive foil, or a conductive sheet.

In some embodiments, a plurality of dice are mounted in each two dimensional array of contact posts so that a plurality of separate semiconductor packages are formed over each two dimensional array of contact posts.

In some embodiments, the encapsulation is done using a molding process. Each semiconductor package may be individually molded, or an encapsulant cap may be formed over each two dimensional array of device areas. In arrangements where group molding is done, the encapsulant cap is then cut to singulate the semiconductor packages.

In a separate aspect of the invention, a multiplicity of contacts are stamped or otherwise cut from a conductive sheet. A stencil is then used to positioning the contacts on an adhesive carrier so that a multiplicity of electrically and physically isolated contacts are supported by the carrier. A plurality of dice are mounted on the carrier (either directly on the carrier or on some of the isolated contacts) and electrically connected to a plurality of associated contacts. After the dice have been positioned and electrically connected, the dice are and portions of the contacts are encapsulated while leaving bottom portions of the contacts exposed to facilitate electrical connection to external devices. With this arrangement, the encapsulant serves to hold the contacts in place after the carrier has been removed.

BRIEF DESCRIPTION OF THE DRAWINGS

The invention, together with further objects and advantages thereof, may best be understood by reference to the following description taken in conjunction with the accompanying drawings in which:

FIG. 2(a) is a diagrammatic top view of a carrier strip suitable for use in one embodiment of the present invention;

FIG. 2(b) is a diagrammatic side view of the lead frame carrier strip of FIG. 2(a) taken along line 2(b)-2(b) of FIG. 2(a);

FIGS. 7(a)-7(e) illustrate a series of steps in accordance with one method of forming of the carrier strip illustrated in FIG. 2(a);

FIGS. 8(a)-8(e) illustrate a series of steps in accordance with a second method of forming of the carrier strip illustrated in FIG. 2(a).

DETAILED DESCRIPTION OF THE PREFERRED EMBODIMENTS

Figure 1:
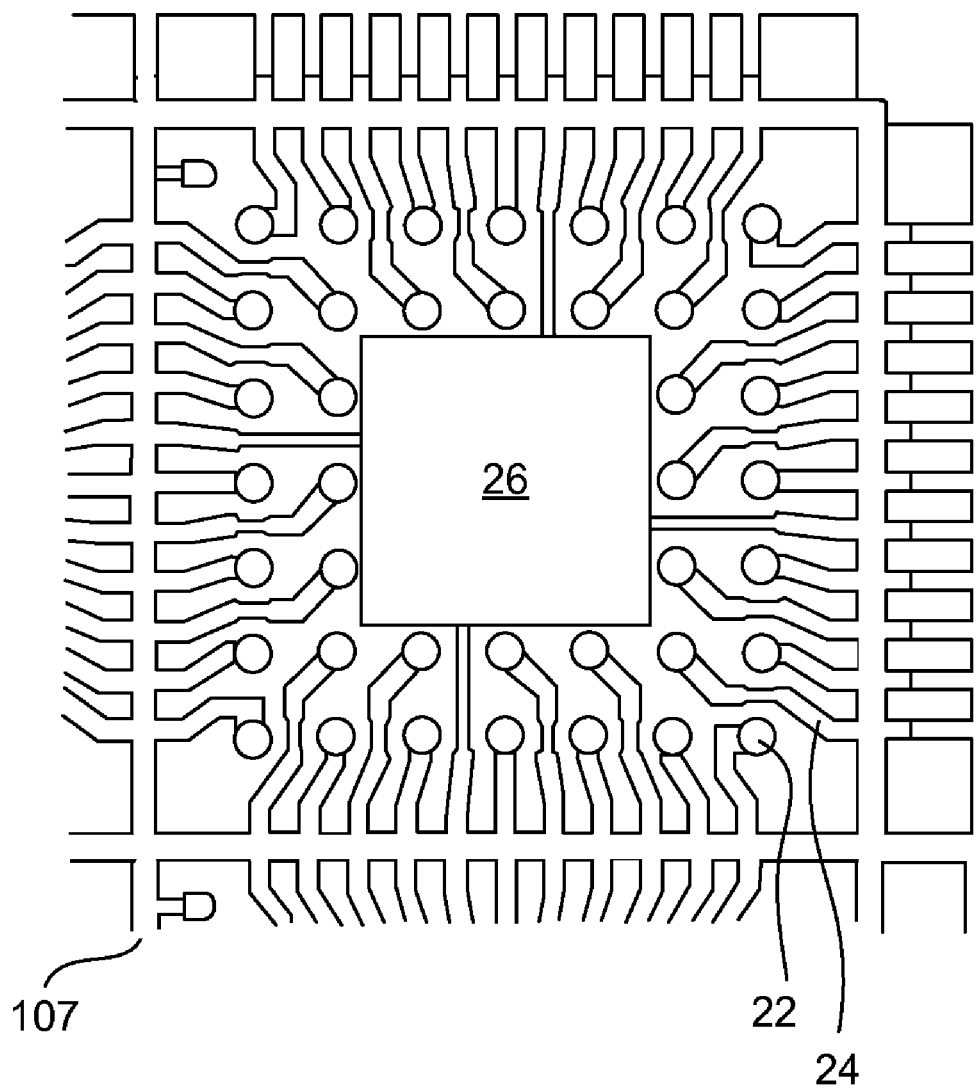
FIG. 1 is a diagrammatic top view of a conventional micro-array leadframe.

The present invention relates generally to the packaging of integrated circuits in micro-array style packages. Referring initially to FIGS. 2(a) and 2(b), a carrier panel 100 in accordance with a first embodiment of the invention will be described. In this embodiment, the panel 100 includes a carrier tape 102 that supports a multiplicity of contacts 110. A leadframe 120 is provided to give the panel structural rigidity. In the illustrated embodiment, the leadframe includes rails 122 that extend around the periphery of the carrier tape 102 and cross bars 125 that divide the panel into a plurality of sections 105. However, it should be appreciated that the crossbars may be eliminated if a sufficiently rigid structure is provided. Indeed, even the rails could potentially be eliminated if a sufficiently rigid carrier tape is used. The contacts 110 (which may be punched from the leadframe 120) are held in place by an adhesive on the carrier tape 102 such that the contacts 110 are physically and electrically isolated from one another. As will be described in more detail below, the contacts can be positioned on the carrier tape in a variety of manners.

In the illustrated embodiment, the carrier panel 100 is arranged as a strip having three sections 105, with each section 105 having a two-dimensional arrays of contacts 110 positioned thereon. The strip format is similar to a leadframe strip and has the advantage that once the contacts are positioned, conventional leadless leadframe or micro-array leadframe handling equipment may be used to complete the packaging of the integrated circuits. However, it should be appreciated that panel may have a wide variety of geometries and is not limited to strip type configurations. Additionally, the number of sections in a panel may be widely varied from one to many.

Figure 3:
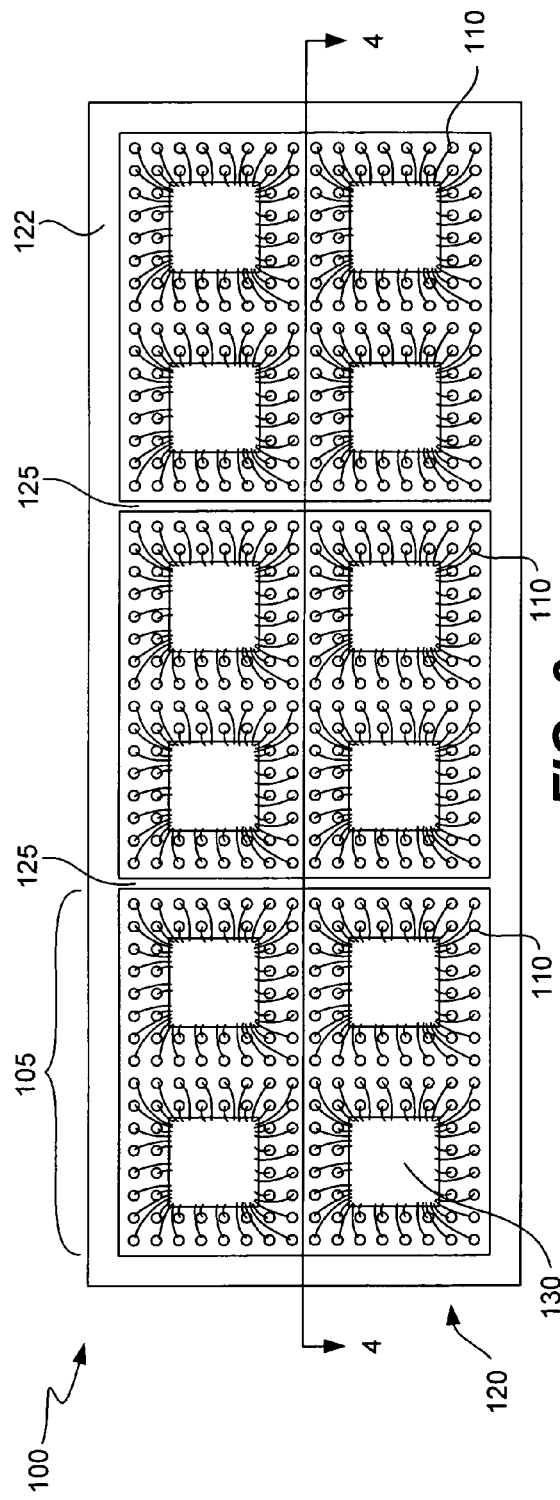
FIG. 3 is a diagrammatic top view of the carrier strip illustrated in FIG. 2(a) after dice have been mounted on the strip.

After the contacts have been positioned, a plurality of dice are mounted on the panel (and particularly on some of the contacts 110) as illustrated in FIG. 3 using conventional die bonding techniques. By way of example, a non-conductive die attach film or epoxy may be used to secure the die to its underlying contacts. Any number of dice may be mounted in each section. In the illustrated embodiment, several dice 130 are mounted in each section, although it should be appreciated that in alternative embodiments, a single die may be mounted in each section. Although the dice 130 are shown as being mounted on some of the contacts, it should be appreciated that in alternative embodiments, open regions (not shown) could be provided on the carrier tape by eliminating some of the contacts to permit the dice to be mounted directly on the carrier tape. This arrangement is diagrammatically illustrated in the far right device area of FIG. 5.

Figure 4:
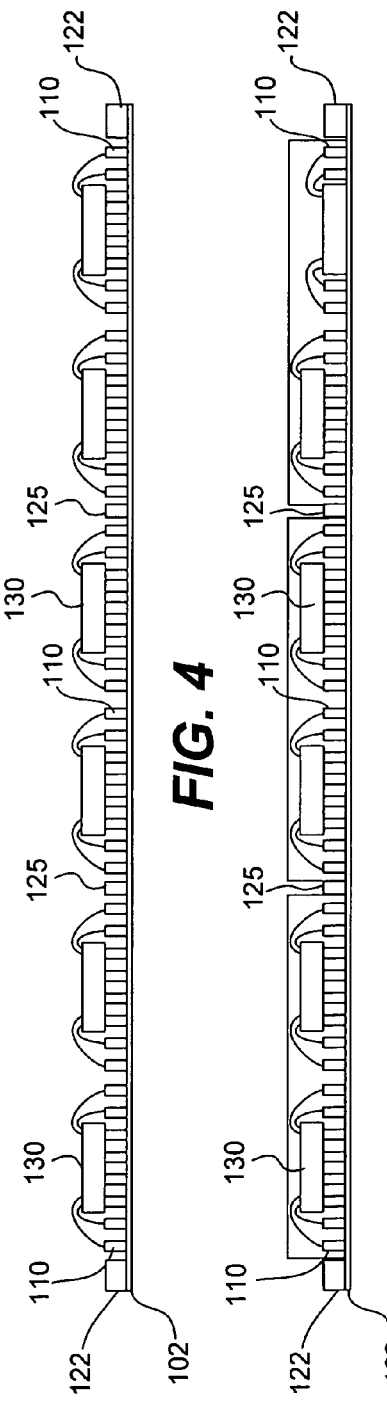
FIG. 4 is a diagrammatic side view of the carrier strip illustrated in FIG. 3 after dice have been electrically connected to the contact pads.

After the dice 130 have been mounted on the panel 100, they are electrically connected to associated contacts 110 by wire bonding or other suitable electrical connection techniques. When wire bonding is used, bonding wires 135 couple the dice to their associated contacts 110 as best illustrated in FIG. 4.

Figure 5:
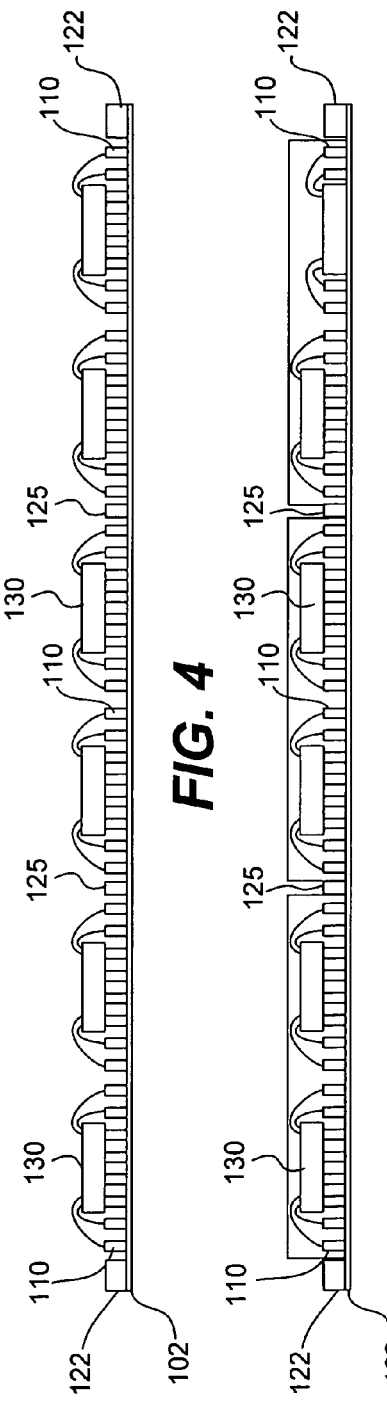
FIG. 5 is a diagrammatic side view of the carrier strip illustrated in FIG. 4 after dice encapsulation.

Once the dice 130 have been electrically connected to the contacts 110, the dice are encapsulated using conventional encapsulation techniques such as molding, dispensing or the like. As best illustrated in FIG. 5, the encapsulant 140 is delivered with the carrier tape 102 in place so that the encapsulant covers the bonding wires 135, the active surfaces of the dice 130 and the fills the gaps between adjacent contacts 110. Since the bottom surfaces of the contacts adhere to the carrier tape 102 during encapsulation, the encapsulant does not cover the bottom contact surfaces. Therefore, when the carrier tape is removed, the bottom surfaces of the contacts are exposed and substantially co-planar with the bottom surface of the encapsulant and resulting package.

After the dice have been encapsulated, the packages may be tested in panel form at any time because the contacts are inherently physically and electrically isolated from one another. Additionally, any other desired panel based packaging steps can be performed.

The dice may be individually molded or group molded. When group molding, an encapsulant cap may be formed over a plurality of dice (as for example all of the dice within a section). If the dice are individually molded, they may readily be separated into individual packages simply by removing the carrier tape. If the dice are group molded, they may be separated into individual packages using conventional singulation techniques such as sawing, laser cutting and the like.

In some implementations, it may be desirable to form solder bumps on the contact pads. This can be accomplished in panel form by placing a second tape on the top surface of the molding material and removing the carrier tape to expose the contacts 110. The contacts are then bumped using conventional solder bumping techniques.

Figure 6:
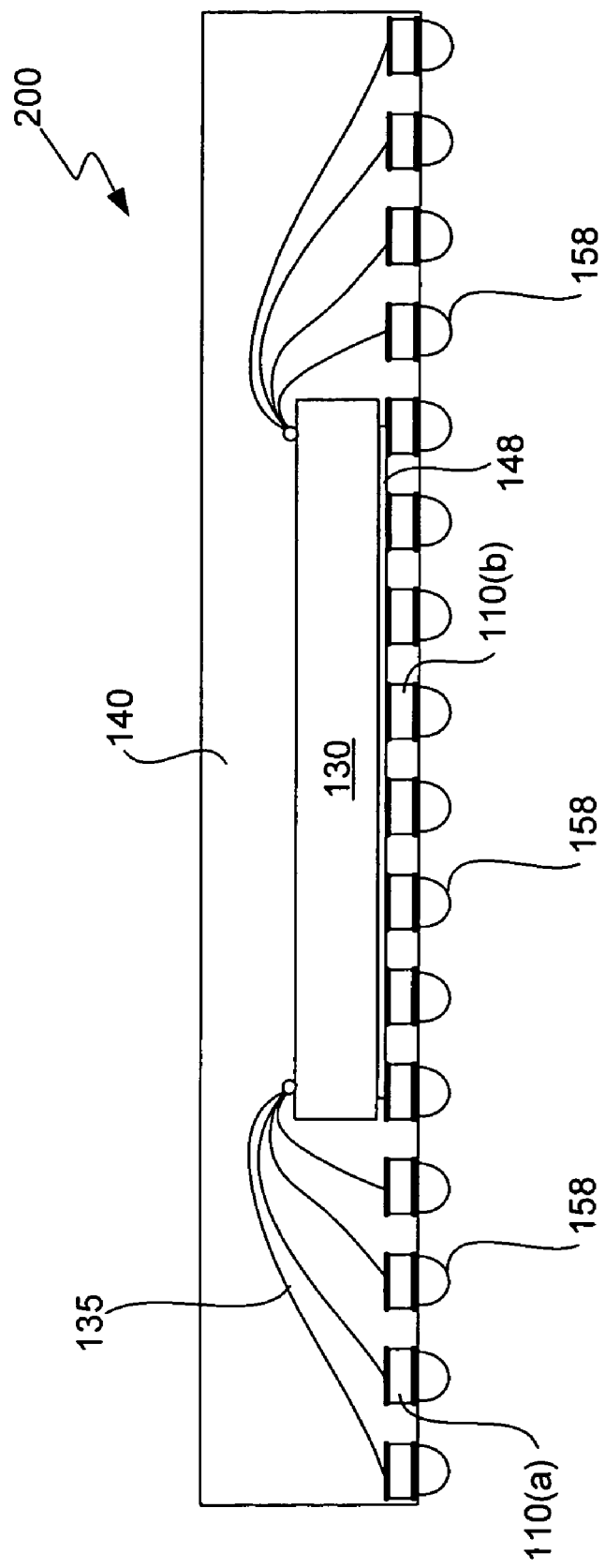
FIG. 6 is a diagrammatic side view of a packaged integrated circuit in accordance with an embodiment of the present invention.

A resultant package is illustrated in FIG. 6. As seen therein, the package 200 includes a die 130 that is physically secured to a number of underlying contacts by a nonconductive die attach tape 148. The die 130 is electrically connected to a plurality of electrical contacts 110 by bonding wires 135. An encapsulant 154 encapsulates the contacts 110, the die 130 and the bonding wires 135 while leaving bottom surfaces of the contacts 110 exposed. Solder bumps 158 may be provided on the contacts 110 if desired. In the illustrated embodiments, some of the contacts are electrically active (e.g., contacts 110(a)), whereas the contacts under the die (e.g., contacts 110(b)) simply act as thermal conductors which help transfer heat away from the die. Of course, in other implementations, the contacts under the die could be electrically connected to 110 or ground pads formed on the bottom surface of the die. In many implementations, all of the contacts 110 would have solder bumps. However, as illustrated in FIG. 6, that is not a requirement.

A variety of methods may be used to form the contacts and positioning the contacts. Generally, a conductive sheet 204 is initially provided as illustrated in FIG. 7(a). The conductive sheet 204 may be formed from any suitable conductive material such as a standard strip-form copper lead frame blank. Generally, a number of contacts 110 are formed from the conductive sheet and placed on the carrier tape 102. As will be appreciated by those familiar with the art, it is typically desirable to plate the contacts with a material that adheres better to solder and the bonding wires than copper. Although not required, it is generally preferable to do the plating before the contacts are isolated from the lead frame strip.

To accomplish the plating, masks are applied to each side of the strip 204 to define a number of opposing openings that will define the size of the resulting contacts 110. The openings are then plated with a suitable plating material 208 such as a Ni/Pd/Au plating stack and the mask is stripped away. A suitable resultant structure is illustrated in FIG. 7(b). The plating layer helps prevent oxidation of the copper and provides a better adhesion surface for solder and the (typically gold) bonding wires.

It would be possible to eliminate the masking step and plate both surfaces of the conductive sheet. However, since most satisfactory plating materials are relatively expensive, it is typically undesirable to waste too much plating material. Of course, in other embodiments, it may be desirable to eliminate the plating entirely.

After the plating has been completed, the contacts 110 (and if desired the leadframe rails and bars 122, 125) are isolated using any of a number of suitable techniques. By way of example, the conductive strip may be stamped, punched or etched to form a multiplicity of contacts 110 (sometimes referred to herein as contact "coins") together with any desired bars and rails. When etching, it may be desirable to etch both the sides of the conductive sheet, although this is not a requirement.

Stamping or punching may be accomplished in a variety of manners. In some embodiments the coins 110, rails 122 and bars 125 may be stamped together from a lead frame strip in a manner such that they are pressed directly onto the carrier tape 102 during the stamping operation. In such an embodiment, suitable sized and shaped anvils and punches may be used to facilitate the stamping.

However, as can best be seen in FIG. 2(a), in a typical application, much of the metal material from the lead frame blank used as the conductive sheet 204 in the just described punching is effectively wasted. Therefore, in another punching approach, the contact coins 110 can be separately punched from a conductive sheet in a manner that more efficiently utilizes the material in the conductive sheet. That is, the contact coins 110 can be punched at a much closer spacing than will be used on the carrier. For example, the contact coins can effectively be punched from regions of the conductive sheet that are immediately adjacent one another. The contact coins 110 are then collected and placed on the tape in a separate operation.

By way of example, as illustrated in FIG. 7(d), a stencil 275 may be used to position the contact coins. In this arrangement the stencil 275 is placed in a vibration box (not shown) or other suitable hole-filling device. The thickness of the stencil may be thinner than the thickness of the contact coins 110, so that only one contact coin 110 can be held in any stencil opening. Once the contact coins 110 are vibrated into position (or otherwise positioned in the stencil), the carrier 102 may be pressed into contact with the contacts as illustrated in FIG. 7(e), so that the contacts are firmly held in place by the carrier. This approach has the advantage of more efficiently using the material in the conducting sheet. An additional advantage of this approach is that it may eliminate the need to mask the conductive sheet before plating. It should also be appreciated that when such an arrangement is used, the lead frame bars 122 and rails 125 do not need to be created from each conductive strip. Rather, a separate reusable carrier support frame may be utilized to provide structural support to the carrier tape. The carrier support frame may have the same general geometry as the rails and bars of the lead frame discussed above.

Referring next to FIGS. 8(a)-(e), another method of positioning contacts on a carrier will be described. In this embodiment a conductive sheet (which again, may take the form of a blank lead frame strip or panel 304 as shown in FIG. 8(a)) is masked (e.g., by mask-307) and partially etched in a manner that defines a number of islands 310 as best seen in FIG. 8(b). The sheet is etched sufficiently so that only a very thin connecting piece 309 remains to support the islands 310. In the illustrated embodiment, the conductive sheet is etched from both sides, although this arrangement is preferred in many applications, it is not a requirement.

After the islands have been defined, the etching mask may be removed and the islands may be plated as shown in FIG. 8(c). As described above, it is typically desirable to mask the lead frame panel 304 prior to plating so that the plating material is not overly wasted. Once the islands 310 have been plated, the lead frame is placed on an adhesive carrier 102 as illustrated in FIG. 8(d). After the lead frame panel has been placed on the adhesive carrier, the connecting sheets are severed to isolate the islands 310, thereby forming the desired contacts 110. The lead frame strip 304 is originally etched so that the relative spacing of the islands 310 is exactly the same as the desired spacing of the resulting contacts. Therefore, once the islands have been severed apart, the contacts are positioned in their desired location on the tape.

Although only a few embodiments of the invention have been described in detail, it should be appreciated that the invention may be implemented in many other forms without departing from the spirit or scope of the invention. In several of the illustrated embodiments the conductive sheet from which the contacts 110 are formed takes the form of a conventional metal lead frame (which may be formed from a variety of materials including copper, copper alloys and other suitable metals and materials). The use of lead frame strip sized panels has the advantage of being inherently compatible with existing packaging equipment. However, in other embodiments, generally thinner conductive sheets or even metal foils, may be used to create the contacts. Additionally, the geometry of the conductive panels may be widely varied.

In the embodiments shown, the contacts 110 are substantially circular. However, it should be appreciated, that the geometry of the contacts can be widely varied. For example, they may be substantially square, hexagonal, octagonal, rectangular or any other desired shape. Similarly, in some of the illustrated embodiments, lead frame rails and bars are provided to give structural support to the carrier tape. It should be appreciated that the geometry, configuration, width and/or length of the lead frame support structures may be widely varied and that when a self supporting carrier is used, they could even be eliminated.

Therefore, the present embodiments are to be considered as illustrative and not restrictive and the invention is not to be limited to the details given herein, but may be modified within the scope and equivalents of the appended claims.

What is claimed is:

1. A method of packaging semiconductor devices comprising:

generating a multiplicity of loose separated solid contacts;

providing a stencil arranged with a plurality of openings formed therein, the plurality of openings configured in a spaced apart arrangement, each opening sized to accommodate the placement of one of said loose separated solid contacts;

providing an adhesive carrier having an adhesive treated surface having a layer of adhesive material formed thereon;

placing the previously formed multiplicity of loose separated solid contacts into the plurality of openings of the stencil to position the loose separated solid contacts in the spaced apart arrangement corresponding to a desired pattern of contacts;

adhering the loose separated solid contacts arranged in the stencil onto the adhesive treated surface of the adhesive carrier, thereby adhering the multiplicity of loose separated solid contacts onto the adhesive treated surface in said desired pattern of contacts supported by the adhesive carrier;

removing the stencil;

mounting a plurality of dice on the desired pattern of contacts such that each die is mounted on a plurality of contacts comprising the desired pattern of contacts;

wire bonding selected ones of the contacts comprising the desired pattern of contacts to associated electrical contact points of the die using wire connectors;

encapsulating the dice and portions of the contacts comprising the desired pattern of contacts with an encapsulant while protecting bottom surfaces of the contacts comprising the desired pattern of contacts from exposure to said encapsulant, wherein the encapsulant flows between the contacts comprising the desired pattern of contacts thereby holding the desired pattern of contacts in place and encapsulating said wire connectors, whereby a plurality of semiconductor packages are formed.

2. A method as recited in claim 1, wherein the encapsulation is done using a molding process.

3. A method as recited in claim 1, wherein the multiplicity of loose separated solid contacts comprising the desired pattern of contacts are adhered to the adhesive treated surface as a plurality of two dimensional arrays of contacts and wherein the plurality of dice are mounted in each two dimensional array of contacts so that a plurality of separate semiconductor packages are formed over each two dimensional array of contacts.

4. A method as recited in claim 3, wherein an encapsulant cap is formed over each two dimensional array, the method further comprising cutting the encapsulant cap to singulate the plurality of separate semiconductor packages.

5. A method as recited in claim 1, wherein each semiconductor package is individually molded.

6. A method as recited in claim 1, further comprising removing the adhesive carrier from the encapsulated dice.

7. The method of packaging recited in claim 6 further including depositing solder balls on an exposed bottom surface of at least some of said contacts of the desired pattern of contacts.

8. The method of packaging recited in claim 1, wherein said encapsulating the dice includes flowing the encapsulant between the separated contacts of the desired pattern of contacts and underneath the die to encapsulate the die.

9. The method of packaging recited in claim 1, wherein said removing the stencil further includes removing the stencil so that the multiplicity of solid contacts remain adhered to the adhesive material of the carrier in said desired pattern of contacts.

10. The method of packaging recited in claim 1, wherein at least some of the multiplicity of loose separated solid contacts are adhered onto the adhesive layer in said desired pattern of contacts such that the desired pattern comprises a two dimensional array of separated solid contacts and wherein said two dimensional array of separated solid contacts is surrounded by a structurally rigid frame that supports the separated solid contacts and the adhesive carrier.

11. The method of packaging recited in claim 1, wherein at least some of the multiplicity of loose separated solid contacts are adhered onto the adhesive layer of the adhesive carrier so that said desired pattern of contacts comprises a two dimensional array of separated solid contacts and wherein said adhesive carrier is sufficiently stiff as to support the solid contacts and the die.

12. The method of packaging recited in claim 1, wherein said generating the multiplicity of loose separated solid contacts further includes the loose separated solid contacts comprising a layer of conducting material onto at least one of top or bottom surface of the loose separated solid contacts.

13. The method of packaging recited in claim 1, wherein said adhering the loose separated solid contacts on the adhesive treated surface of the adhesive carrier comprises filling all of the openings of the stencil with loose separated solid contacts and then adhering them to the adhesive carrier all at once.

* * * * *

UNITED STATES PATENT AND TRADEMARK OFFICE
CERTIFICATE OF CORRECTION

| | | |
|---|---|---|
| PATENT NO. | : 7,846,775 B1 | Page 1 of 1 |
| APPLICATION NO. | : 11/135836 | |
| DATED | : December 7, 2010 | |
| INVENTOR(S) | : Lee et al. | |

It is certified that error appears in the above-identified patent and that said Letters Patent is hereby corrected as shown below:

In the Specification:

Column 4, line 43, change "110" to --I/O--

Signed and Sealed this
Eighth Day of November, 2011

David J. Kappos
*Director of the United States Patent and Trademark Office*